United States Patent
Lee et al.

(10) Patent No.: US 9,443,734 B2
(45) Date of Patent: Sep. 13, 2016

(54) SEMICONDUCTOR MEMORY DEVICES AND MANUFACTURING METHODS THEREOF

(71) Applicant: Samsung Electronics Co., Ltd., Suwon-si, Gyeonggi-do (KR)

(72) Inventors: Ki-Seok Lee, Busan (KR); Jung-Hwan Park, Seoul (KR); Hyo-Jin Park, Incheon (KR); Kyu-Hyun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/574,907

(22) Filed: Dec. 18, 2014

(65) Prior Publication Data

US 2015/0179658 A1    Jun. 25, 2015

(30) Foreign Application Priority Data

Dec. 23, 2013    (KR) .......................... 10-2013-0161502

(51) Int. Cl.
*H01L 21/28*   (2006.01)
*H01L 29/423*  (2006.01)
*H01L 27/108*  (2006.01)

(52) U.S. Cl.
CPC ... *H01L 21/28008* (2013.01); *H01L 27/10894* (2013.01); *H01L 29/4236* (2013.01); *H01L 27/10888* (2013.01); *H01L 27/10891* (2013.01)

(58) Field of Classification Search
CPC ............. H01L 21/28008; H01L 27/11; H01L 27/112; H01L 27/115; H01L 27/10894; H01L 27/10888; H01L 27/10891; H01L 29/4236

See application file for complete search history.

(56) References Cited

U.S. PATENT DOCUMENTS

| | | | |
|---|---|---|---|
| 7,807,513 B1 | 10/2010 | Kim et al. | |
| 7,915,121 B1* | 3/2011 | Kim | .......... H01L 27/10894 257/E21.384 |
| 8,309,412 B2 | 11/2012 | Cho | |
| 2011/0024811 A1 | 2/2011 | Kim | |
| 2011/0260286 A1 | 10/2011 | Lee et al. | |
| 2011/0298040 A1 | 12/2011 | Kim | |
| 2012/0012911 A1 | 1/2012 | Jeong | |
| 2012/0217576 A1 | 8/2012 | Yeo | |
| 2012/0281490 A1 | 11/2012 | Cho | |
| 2014/0061806 A1* | 3/2014 | Eun | .......... H01L 27/10894 257/368 |

FOREIGN PATENT DOCUMENTS

| KR | 1020110119046 A | 11/2011 |
|---|---|---|
| KR | 1020120003741 A | 1/2012 |

* cited by examiner

*Primary Examiner* — Armando Rodriguez
(74) *Attorney, Agent, or Firm* — Myers Bigel & Sibley, P.A.

(57) ABSTRACT

A semiconductor memory device and a manufacturing method of the semiconductor memory device are provided. The semiconductor memory device can include a substrate in which a cell area and a peripheral area are defined, a first gate insulating layer on the peripheral area, and a poly gate layer on the first gate insulating layer to form a combined stack, wherein the combined stack of the first gate insulating layer and the first poly gate layer is absent from the cell area.

12 Claims, 23 Drawing Sheets

1000

1100

1200

SEMICONDUCTOR MEMORY DEVICES AND MANUFACTURING METHODS THEREOF

CROSS-REFERENCE TO RELATED APPLICATION

This application claims priority from Korean Patent Application No. 10-2013-0161502 filed on Dec. 23, 2013, in the Korean intellectual Property Office, and all the benefits accruing therefrom under 35 U.S.C. 119, the contents of which in its entirety are herein incorporated by reference.

BACKGROUND

A memory device using a semiconductor is a storage device which is implemented by using a semiconductor such as silicon (Si), germanium (Ge), gallium arsenide (GaAs), or indium phosphide (InP). A semiconductor memory device is mainly classified into a volatile memory device and a nonvolatile memory device.

The volatile memory device is a memory device in which stored data dissipates when a power supply is cut. The volatile memory device includes a Static RAM (SRAM), a Dynamic RAM (DRAM), a Synchronous DRAM (SDRAM), and the like.

The nonvolatile memory device is a memory device in which stored data is maintained even when a power supply is cut. The nonvolatile memory device includes a Read Only Memory (ROM), a Programmable ROM (PROM), an Electrically Programmable ROM (EPROM), an Electrically Erasable and Programmable ROM (EEPROM), a flash memory device, or a resistive memory device (for example, a Phase-change RAM (PRAM), a Ferroelectric RAM (FRAM), or a Resistive RAM (RRAM)).

With an increase in a degree of integration of semiconductor devices, accordingly, design rules regarding elements of semiconductor devices, including memory devices, are being decreased. As a result, thickness of semiconductor layers, such as the thickness of a poly gate layer, can have an impact on the operation of the semiconductor memory device. As the thickness of the poly gate layer increases over the peripheral and cell area of a semiconductor memory device, the gate stack height increases as well. This increase in gate stack height can cause parasitic capacitance of the bit line.

SUMMARY

Embodiments according to the inventive concept can provide semiconductor memory devices in which the stack height of a poly gate layer of a bit line is decreased in order to reduce a parasitic capacitance of the bit line.

Further embodiments of the inventive concept can provide manufacturing methods of semiconductor memory devices in which the stack height of a poly gate layer of a bit line is decreased in order to reduce a parasitic capacitance of the bit line.

In some embodiments according to the inventive concept, semiconductor memory devices may include a substrate in which a cell area and a peripheral area are defined, a first gate insulating layer on the peripheral area, and a first poly gate layer on the first gate insulating layer, wherein the first gate insulating layer and the first poly gate layer are absent from the cell area.

In some embodiments according to the inventive concept, manufacturing methods of semiconductor memory devices may include steps for forming a gate insulating layer on the peripheral area of a substrate, forming a poly gate layer on the gate insulating layer and the cell area of the substrate, and removing the poly gate layer from the cell area while leaving the poly gate layer on the peripheral area.

In some embodiments according to the inventive concept, manufacturing methods of semiconductor memory devices may include steps for forming a contact recess in the cell area, filling the contact recess with a contact material and forming a layer of the contact material on a top surface of the substrate, removing a plurality of material from the substrate in the peripheral area, forming a gate insulating layer cm the peripheral area and on the remaining layer of the contact material on the cell area, forming a poly gate layer on the gate insulating layer and on the substrate, and removing the poly gate layer from the cell area.

In some embodiments according to the inventive concept, manufacturing methods of semiconductor memory devices may include steps for forming a gate insulating layer on a peripheral area of a substrate, forming a poly gate layer on the gate insulating layer and on a capping layer in a cell area of the substrate, forming a mask on the poly gate layer on the peripheral area and on the cell area etching the mask until the poly gate layer on the cell area is exposed to leave a portion of the mask on the peripheral area, and etching the poly gate layer in the cell area using the portion of the mask on the peripheral area.

DETAILED DESCRIPTION OF THE INVENTIVE CONCEPT

Figure 1:
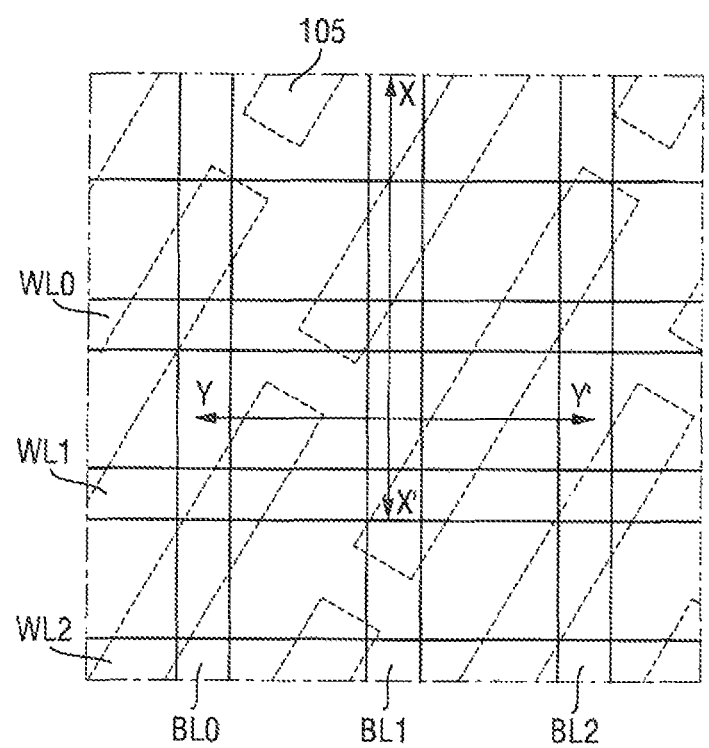
FIG. 1 is a layout diagram of semiconductor memory devices according to embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the scope of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. it will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

it will be understood that when an element or layer is referred to as being "on", "connected to" or "coupled to" another element or layer, it can be directly on, connected or coupled to the other element or layer or intervening elements or layers may be present. in contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non implanted region. Likewise, a buried region fanned by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
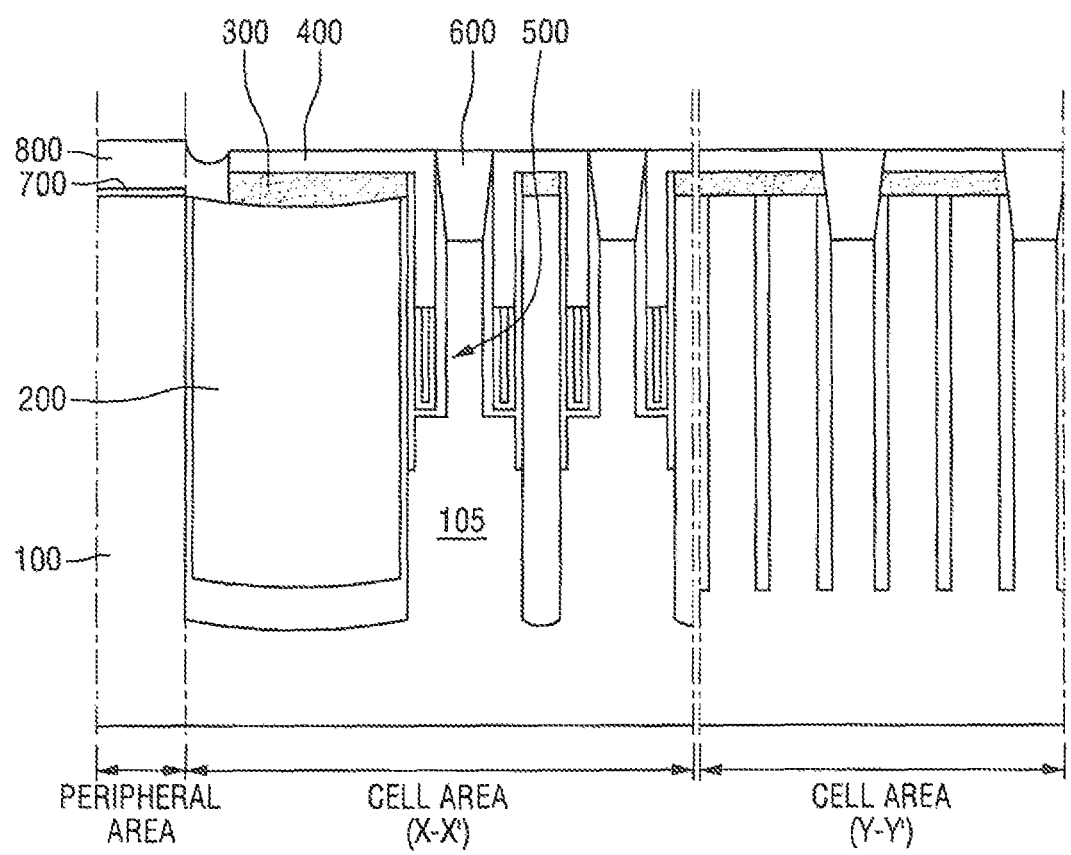
FIG. 2 is a cross-sectional view of areas taken along the lines X-X', and Y-Y' of FIG. 1, and a peripheral area thereof.

FIG. 1 is a layout diagram of semiconductor memory devices according to embodiments of the present inventive concept. FIG. 2 is a cross-sectional view of areas taken along the lines X-X', and Y-Y' of FIG. 1, and a peripheral area thereof.

Referring to FIG. 2, semiconductor memory devices according to embodiments of the present inventive concept may include a substrate 100, a device isolating layer 200, a mask pattern 300, a capping insulating layer pattern 400, a word line structure 500, a contact 600, a first gate insulating layer 700, and a first poly gate layer 800.

A cell area and a peripheral area are defined in the substrate 100. The substrate 100 may be formed of one or more semiconductor materials which are selected from a group consisting of Si, Ge, SiGe, GaP, GaAs, SiC, SiGeC, InAs, and InP. Further, in several embodiments of the present inventive concept, the substrate 100 may be formed of a silicon on insulator (SOI). In the substrate 100, for example, a device isolating layer 200 such as a shallow trench isolation (STI) may be formed to separate a memory element and a transistor from each other. In the cell area, an active area 105 may be defined by the device isolating layer 200. The active areas 105 where the device isolating layer 200 is absent may be repeatedly disposed with an isolated island shape. When an extending direction of the word line structure 500 is considered as a first direction, the active areas 105 are disposed so as not to be perpendicular to the first direction.

The word line structure 500 may include a gate insulating layer which is formed along a surface of a trench and an embedded gate electrode which is provided above the gate insulating layer and disposed within the trench. The embedded gate electrode may include polysilicon. A source/drain may be provided in the substrate on both sides of the embedded gate electrode. The source/drain may include a heavily doped area and a lightly doped area.

The mask pattern 300 and the capping insulating layer pattern 400 may be formed so as to partially enclose an upper portion and a side of the device isolating layer 200 in the cell area So that the mask pattern 300 may serve as an interlayer insulating layer, the mask pattern 300 may be formed of an insulating material. The mask pattern 300 may include silicon oxide. The capping insulating layer pattern 400 may be formed on the mask pattern 300. The capping insulating layer pattern 400 may be formed of a material having an etching selectivity with the mask pattern 300 and may include silicon nitride.

The contact 600 may be formed on the active area 105. A bit line structure which is electrically connected to the contact 600 may be formed. The contact 600 may be formed of a conductive material and for example, may include impurity-doped polysilicon.

The first gate insulating layer 700 may be formed in the peripheral area and may be absent from the cell area. The first gate insulating layer 700 may include silicon oxide. The silicon oxide may be formed by a thermal oxidation process. In some embodiments according to the inventive concept, the first gate insulating layer 700 may include a high dielectric material.

The first poly gate layer 800 may be formed in the peripheral area and absent from the cell area. The first poly gate layer 800 may be on the first gate insulating layer 700. The first poly gate layer 800 may be formed of a conductive material and for example, may include impurity-doped polysilicon. However, a concentration of the impurity which is doped in the polysilicon material of the first poly gate layer 800 may be different from a concentration of the impurity which is doped in the polysilicon material of the contact 600. The first poly gate layer 800 may be formed on the entire surface of the substrate 100 and then the contact 600 is formed using a contact material. Thereafter, a material for the first poly gate layer 800 in the cell area and a contact material on the contact 600 may be removed so that the first poly gate layer 800 may be present in the peripheral area and absent from the cell area.

Figure 3:
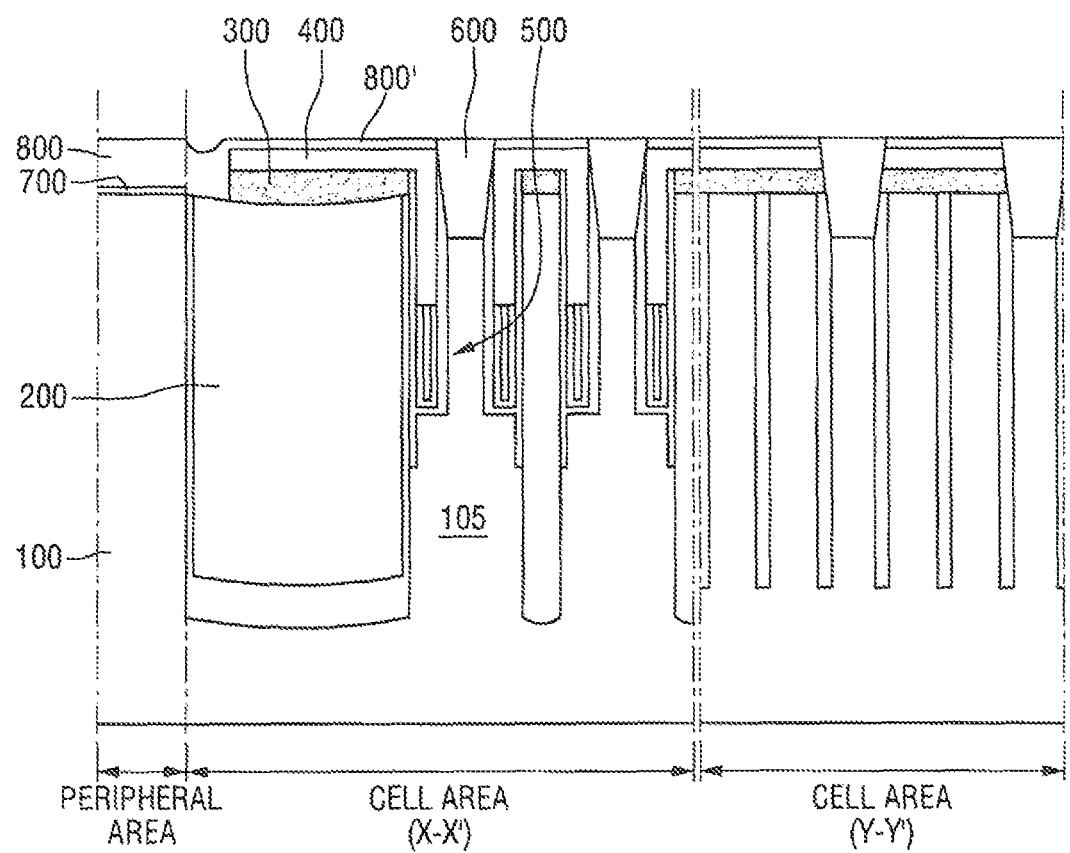
FIG. 3 is a cross-sectional view of semiconductor memory devices according to embodiments of the present inventive concept.

FIG. 3 is a cross-sectional view of semiconductor memory devices according to embodiments of the present inventive concept.

Referring to FIG. 3, semiconductor memory devices according to embodiments of the present inventive concept may include a second poly gate layer 800' in the cell area. A thickness of the second poly gate layer 800' may be lesser than a thickness of the first poly gate layer 800. That is, after forming the first poly gate layer 800 on the entire surface of the substrate 100, the contact 600 may be formed using a contact material and then a material for the first poly gate layer 800 in the cell area and a contact material on the contact 500 may be removed, such that a part of the first poly gate layer 800 remains to form the second poly gate layer 800'. When the second poly gate layer 800' is formed in accordance with the above-mentioned process, the first poly gate layer 800 and the second poly gate layer 800' can be identical materials.

Figure 4:
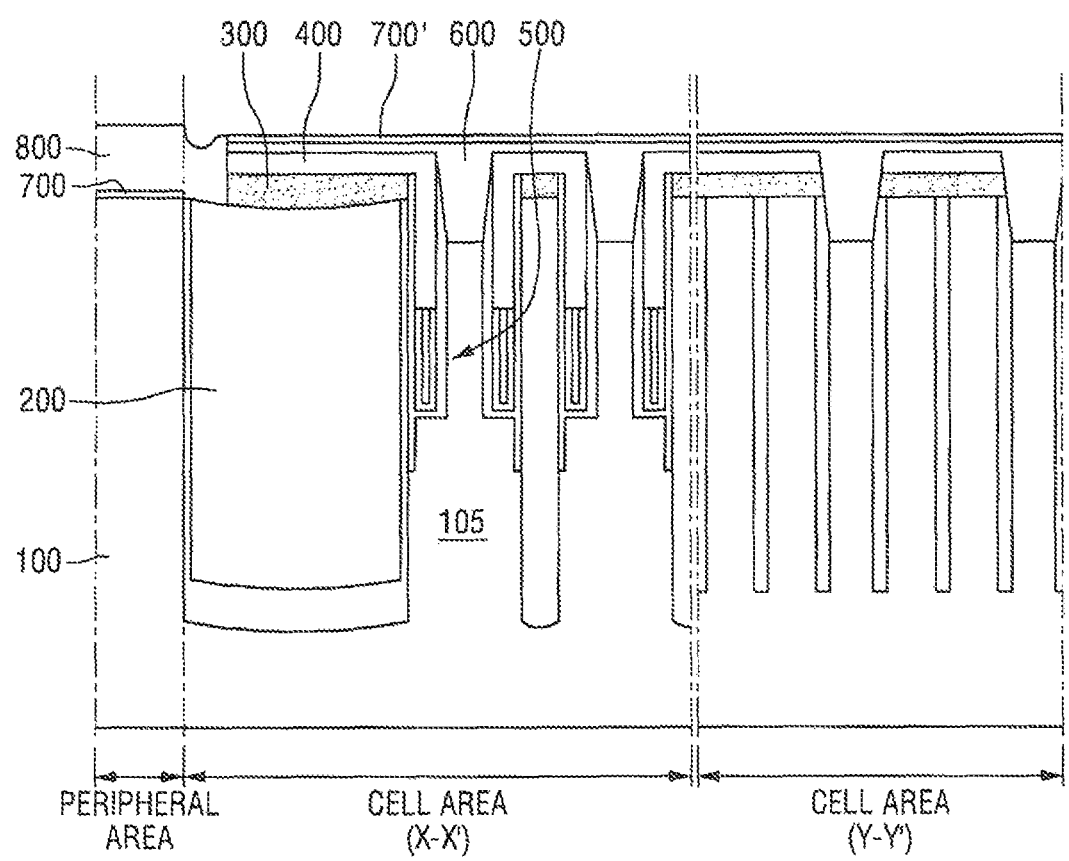
FIG. 4 is a cross-sectional view of semiconductor memory devices according to embodiments of the present inventive concept.

FIG. 4 is a cross-sectional view of semiconductor memory devices according embodiments of the present inventive concept.

Referring to FIG. 4, semiconductor memory devices according to embodiments of the present inventive concept may include a second gate insulating layer 700' in the cell area. In this case, a material of the second gate insulating layer 700' can be identical to the material of the first gate insulating layer 700 and a thickness of the second gate insulating layer 700' can be identical to a thickness of the first gate insulating layer 700. After forming the contact recess in the cell area of the substrate 100, the contact recess may be filled with a contact material to form the contact 600, such that a contact material may be formed on the entire surface of the substrate 100. Next, after removing the material from the peripheral area, the mask pattern 300, and the capping insulating layer pattern 400, first and second gate insulating layers 700 and 700' may be formed on a top surface of the substrate 100. Next, the first poly gate layer 800 may be formed on the entire surface of the substrate 100 and the first poly gate layer 800 in the cell area may be removed to form the structure as illustrated in FIG. 4. An area of the contact 600 may be increased by the contact material (for example, polysilicon) which remains in the cell area, so that the resistance may be lowered.

Hereinafter, manufacturing methods of semiconductor memory devices according to several embodiments of the present inventive concept will be described.

Figure 5:
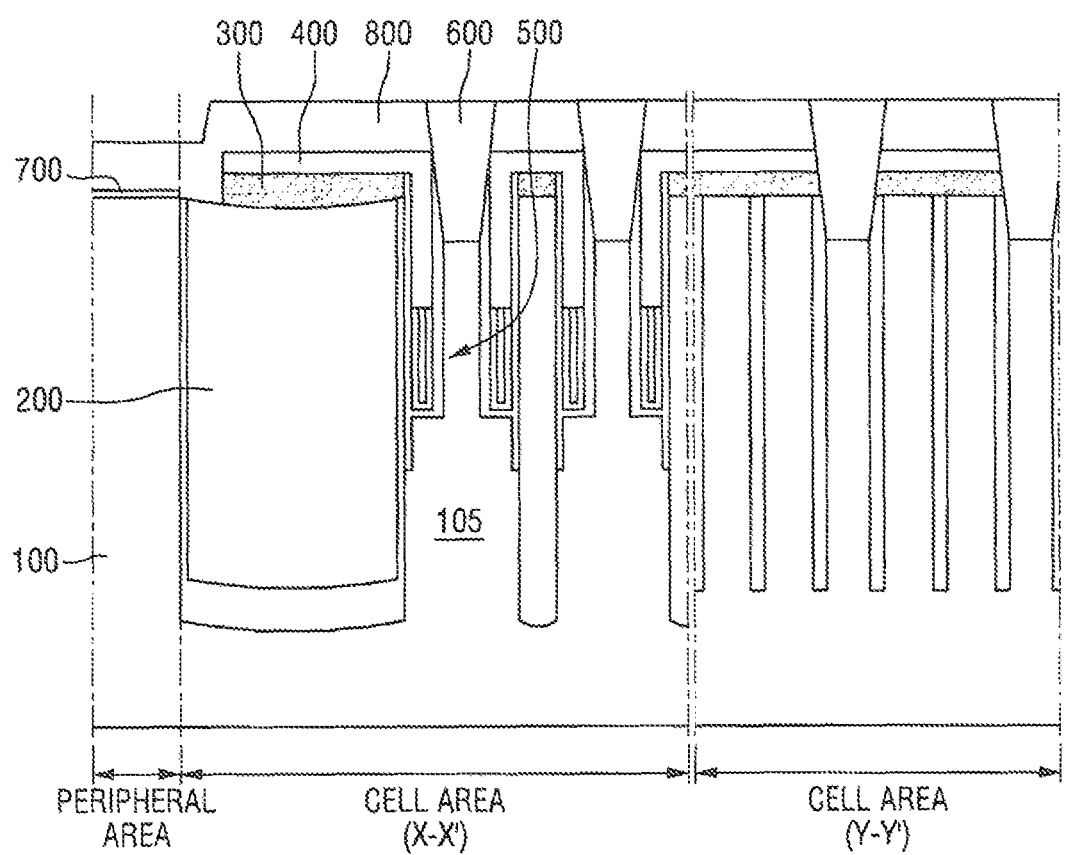
FIG. 5 is a diagram illustrating an intermediate step of manufacturing methods of semiconductor memory devices according to embodiments of the present inventive concept.

FIG. 5 is a view of an intermediate step for explaining manufacturing methods of semiconductor memory devices according to embodiments of the present inventive concept.

Referring to FIGS. 2 and 5, first, a substrate 100 in which a cell area and a peripheral area are defined is prepared. In the cell area, an active area 105 may be defined by the device isolating layer 200. Active areas 105 where the device isolating layer 200 is absent may be repeatedly disposed with an isolated island shape. When an extending direction of the word line structure 500 is considered as a first direction, the active areas 105 may be disposed so as not to be perpendicular to the first direction.

Next, a mask pattern 300 may be formed on the substrate 100. So that the mask pattern 300 may serve as an interlayer insulating layer, the mask pattern 300 may be formed of an insulating material. The mask pattern 300 may include silicon oxide.

Next, a capping insulating layer pattern 400 may be formed on the mask pattern 300. The capping insulating layer pattern 400 may be formed of a material having an etching selectivity with the mask pattern 300 and may include silicon nitride.

Next, a gate insulating layer 700 may be formed in the peripheral area and not in the cell area.

Next, a poly gate layer 800 may be formed on the entire surface of the substrate 100. Next, a contact 600 may be formed, and the poly gate layer 800 in the cell area may be removed using a mask. In this case, an upper portion of the contact 600 may be removed using a planarization process.

Referring to FIGS. 3 and 5, when the poly gate layer 800 in the cell area is removed using the mask, a part of the poly gate layer 800 in the cell area may be removed. Therefore, a part 800 of the poly gate layer 800 may remain in the cell area.

Figure 6:
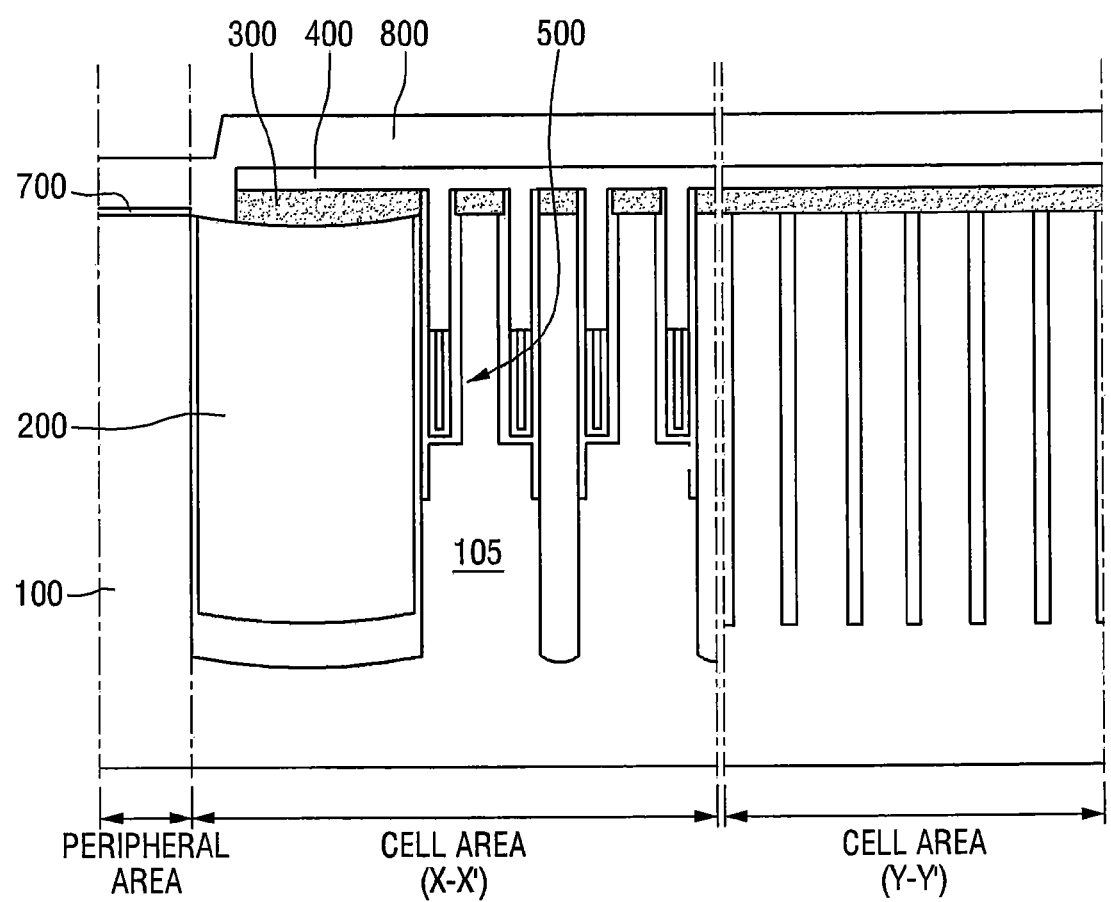
FIGS. 6 to 8 are diagrams illustrating intermediate steps of manufacturing methods of semiconductor memory devices according to embodiments of the present inventive concept.
Figure 7:
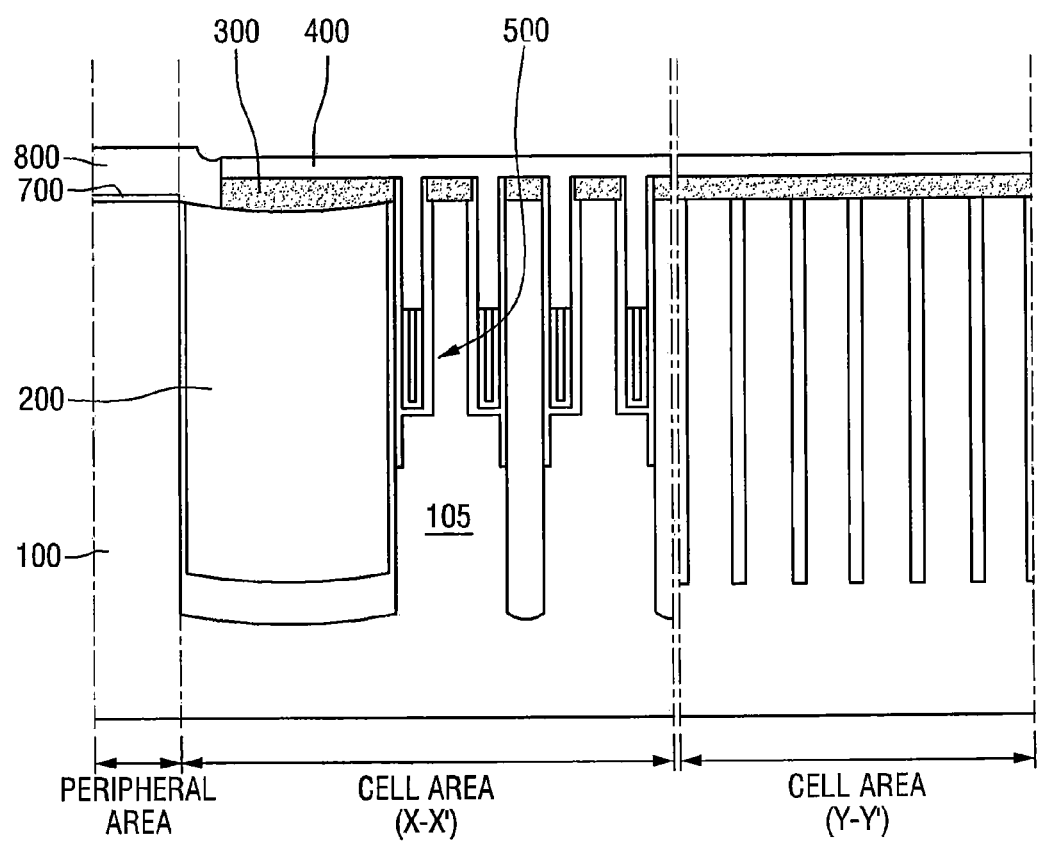
Figure 8:
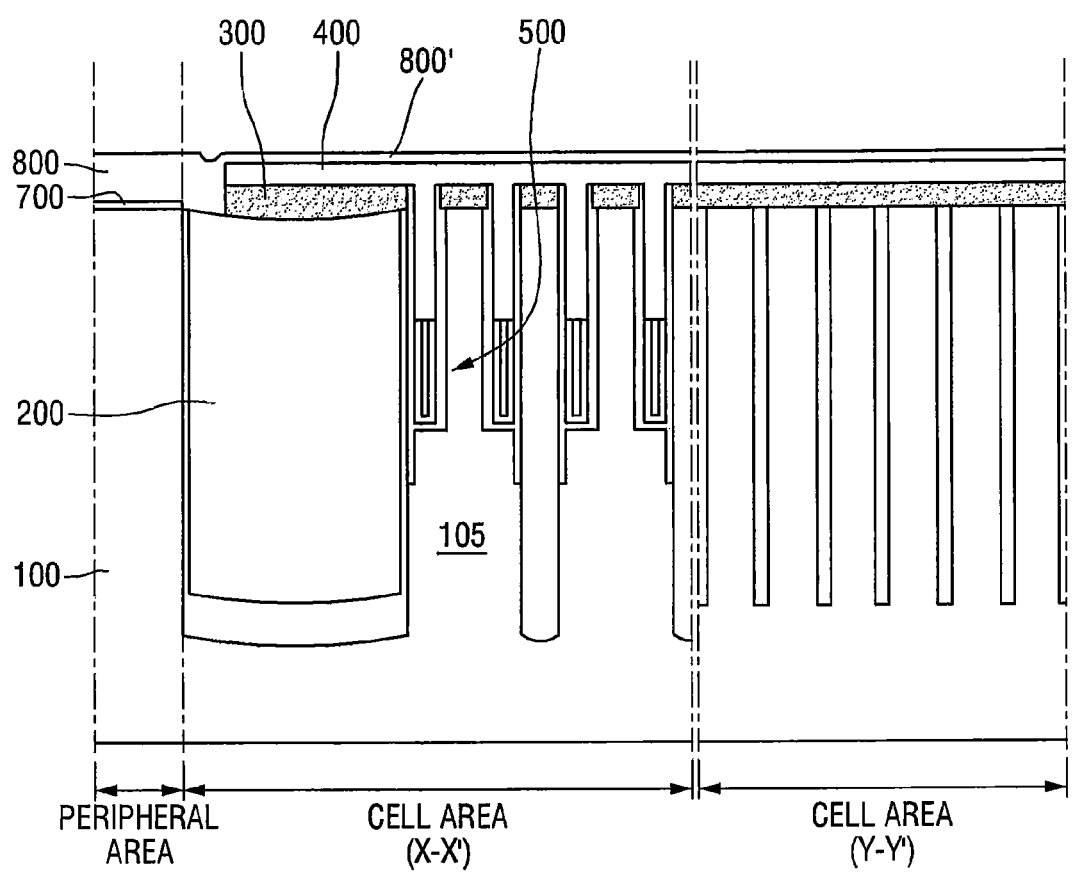

FIGS. 6 to 8 are diagrams illustrating intermediate steps of manufacturing methods of semiconductor memory devices according to embodiments of the present inventive concept.

Referring to FIGS. 6 to 8, after forming the poly gate layer 800 on the entire surface of the substrate 100 and before forming a contact 600, the poly gate layer 800 in the cell area may be removed using a mask. That is, the contact 600 may be formed later. It has been already described that when the poly gate layer 800 in the cell area is removed, a part of the poly gate layer 800 in the cell area may be removed as illustrated in FIG. 8.

FIGS. 9 to 16 are diagrams illustrating intermediate steps of manufacturing methods of semiconductor memory devices according to embodiments of the present inventive concept.

Figure 9:
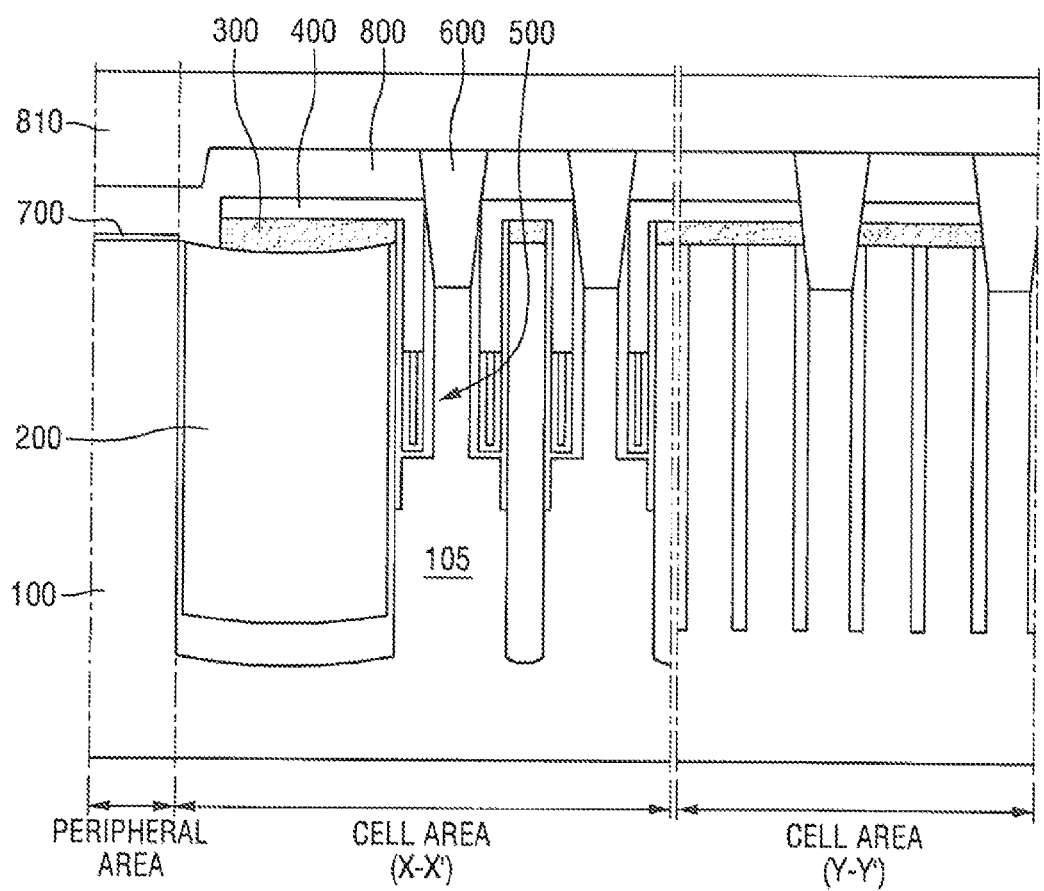
FIGS. 9 to 16 are diagrams illustrating intermediate steps of manufacturing methods of semiconductor memory devices according to embodiments of the present inventive concept.
Figure 10:
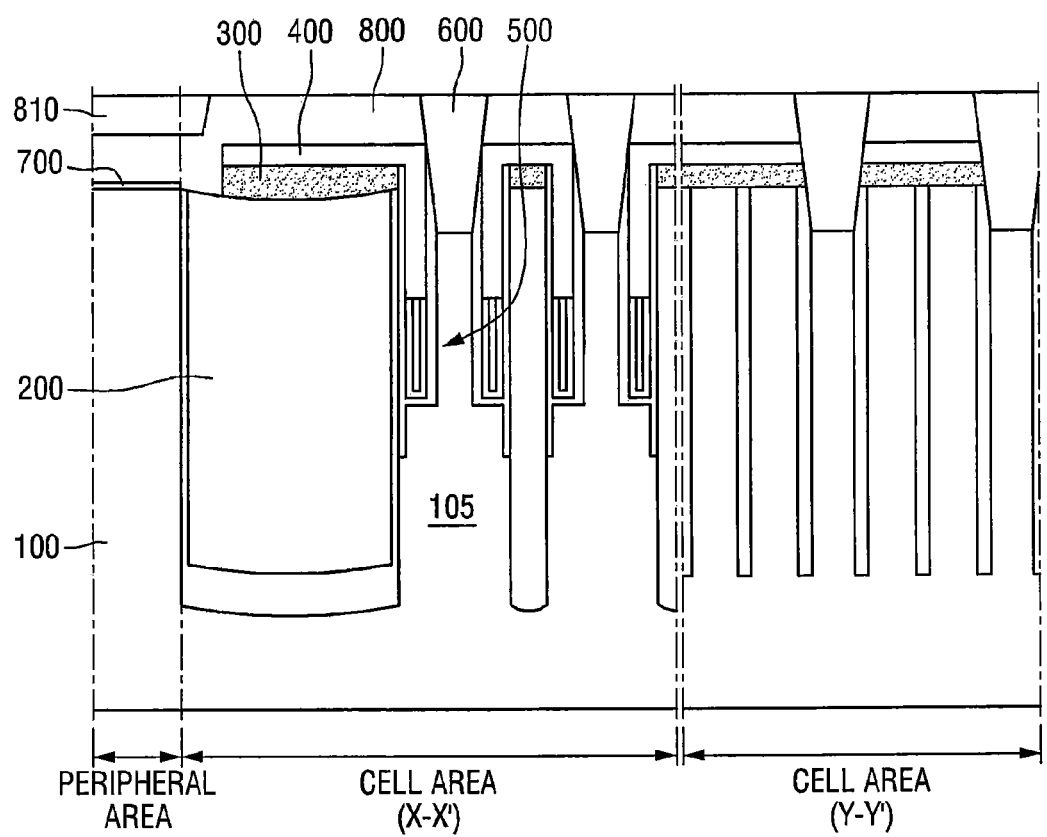
Figure 11:
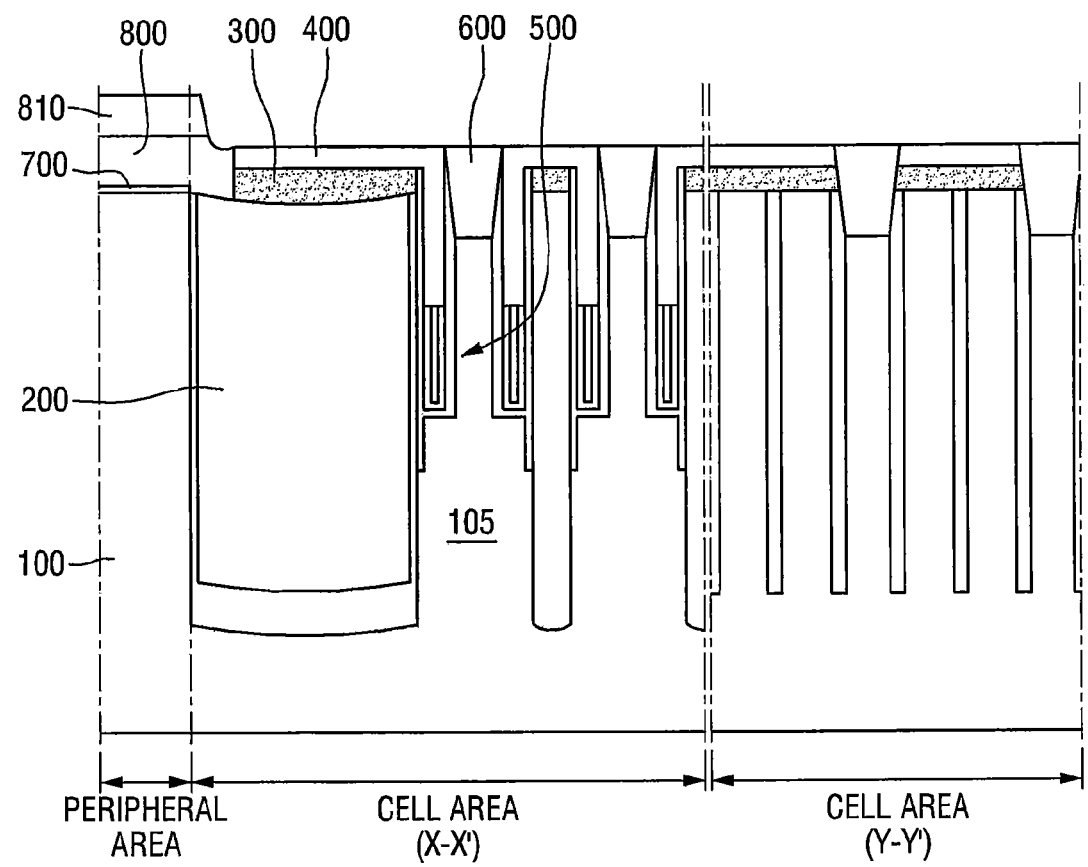
Figure 16:
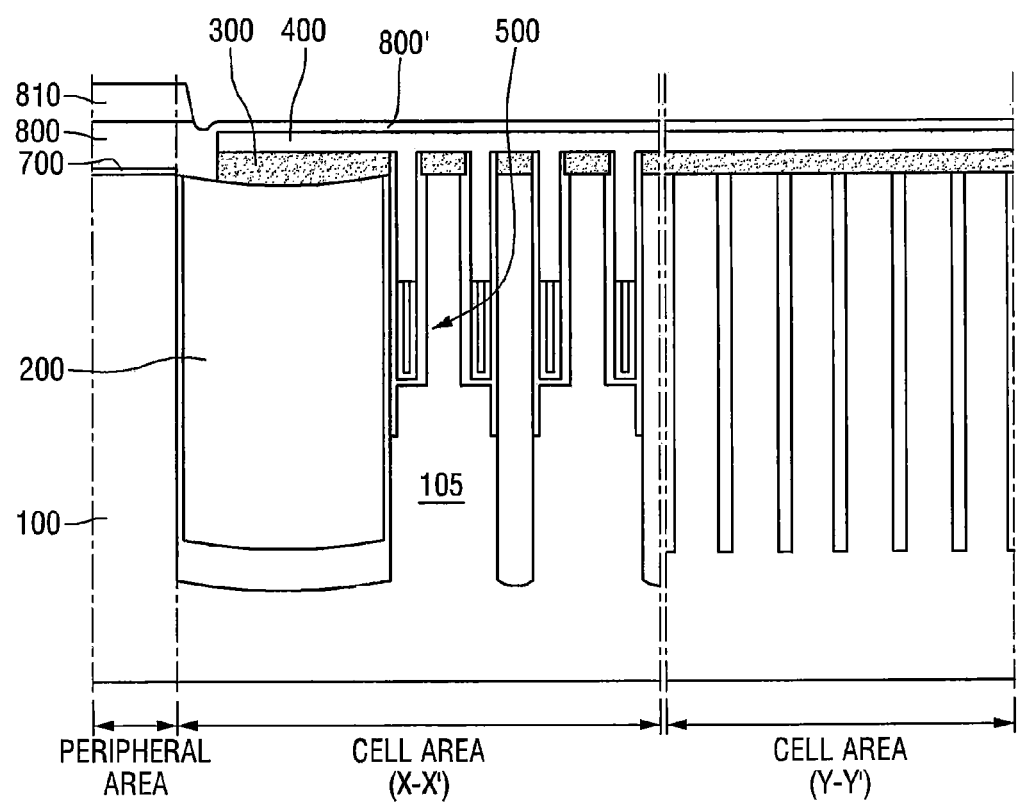

Referring to FIGS. 9 and 16, first, a substrate 100 in which a cell area and a peripheral area are defined may be prepared. Next, a mask pattern 300 may be formed on the substrate 100. So that the mask pattern 300 may serve as an interlayer insulating layer, the mask pattern 300 may be formed of an insulating material. The mask pattern 300 may include silicon oxide. Next, a capping insulating layer pattern 400 may be formed on the mask pattern 300. The capping insulating layer pattern 400 may be formed of a material having an etching selectivity with the mask pattern 300 and may include silicon nitride. Next, a gate insulating layer 700 may be formed in the peripheral area and not in the cell area. Next, a poly gate layer 800 may be formed on the entire surface of the substrate 100. Next, a contact 600 may be formed and the poly gate layer 800 in the cell area may be removed using a mask 810. In this case, the mask 810 may be formed so that a material for the mask 810 is coated to form a step in the materials for the mask 810 which are in the cell area and the peripheral area. Thereafter, the material for the mask 810 in the cell area may be removed using a planarization process and the poly gate layer 800 in the cell area may be removed using the mask 810 which remains in the peripheral area. Further, an upper portion of the contact 600 may be removed using a planarization process.

Figure 12:
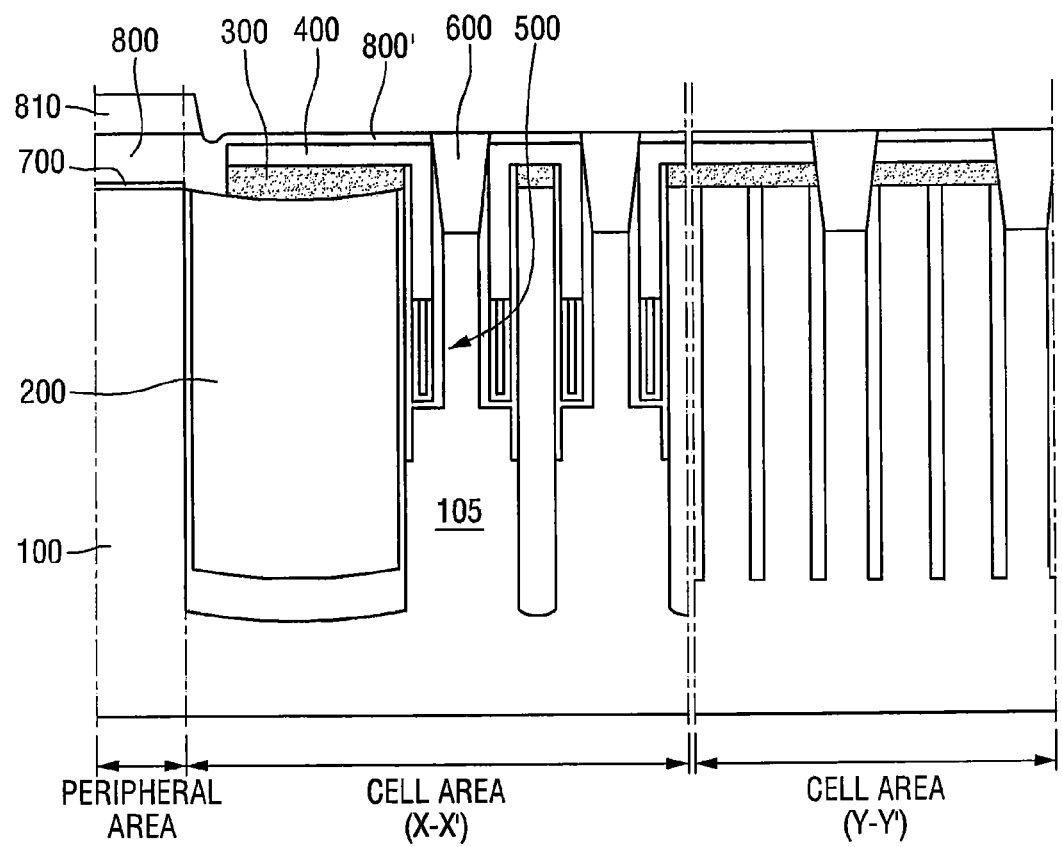
Figure 13:
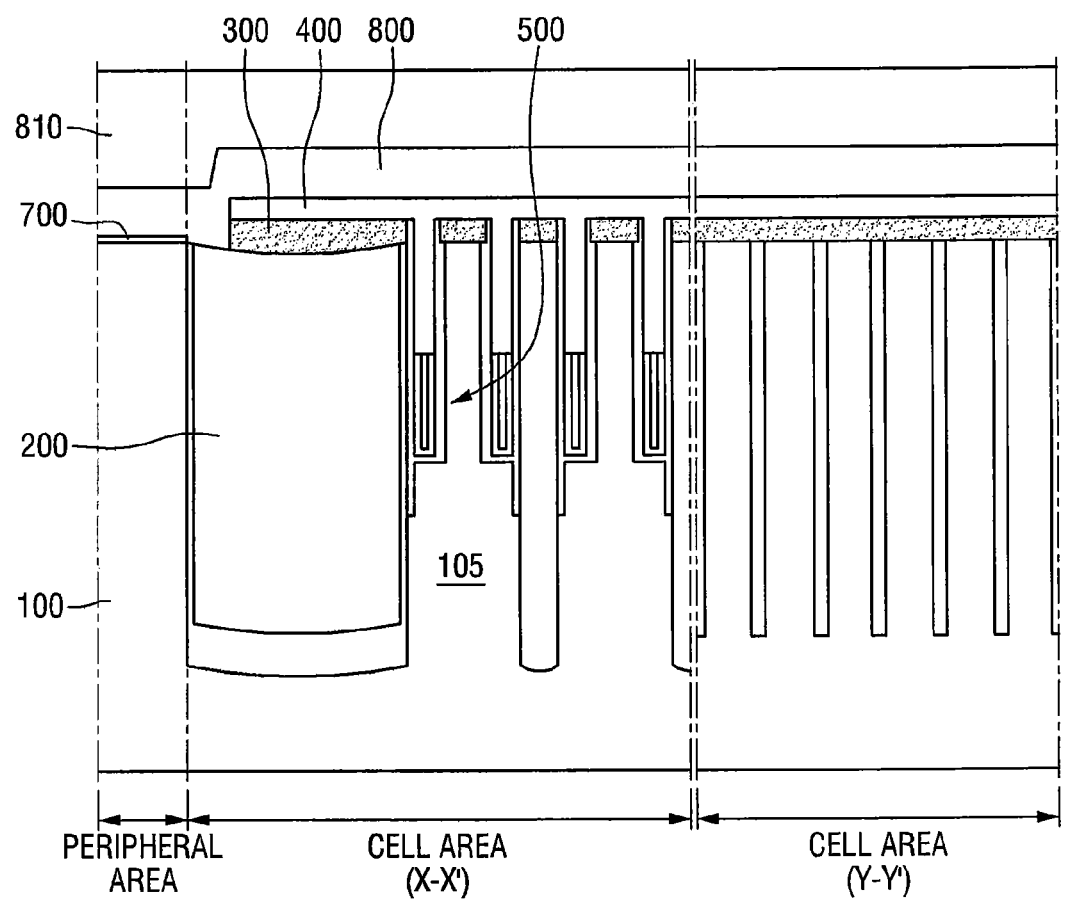
Figure 14:
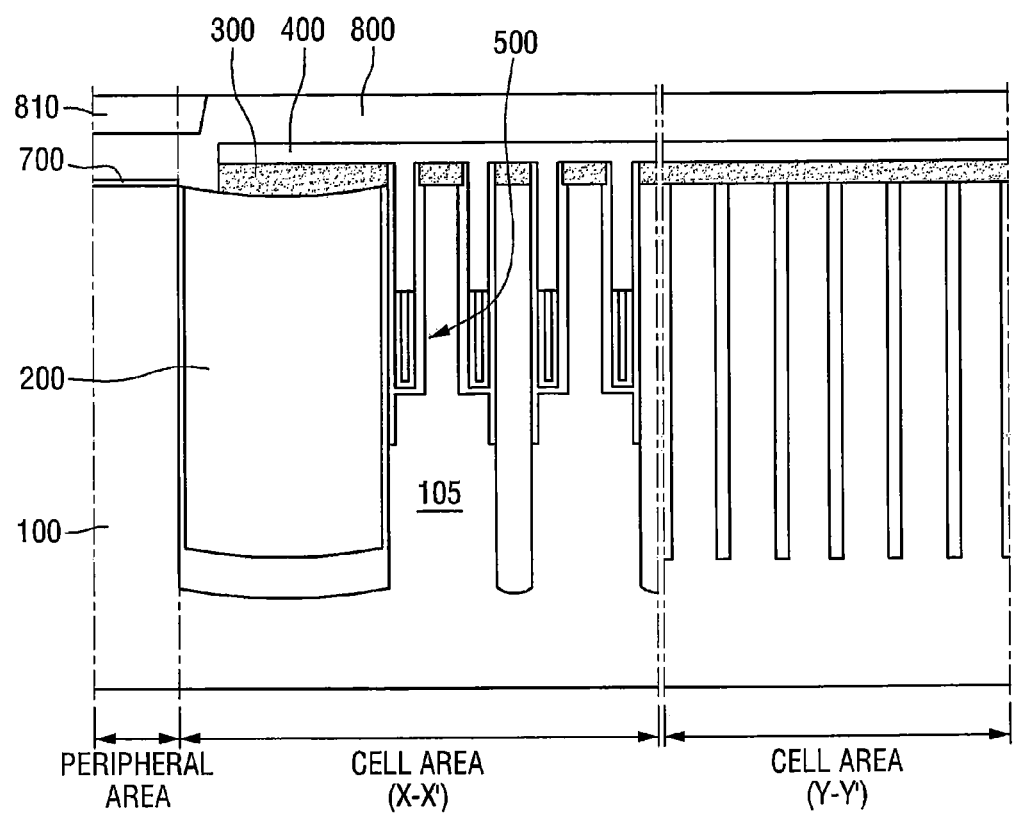
Figure 15:
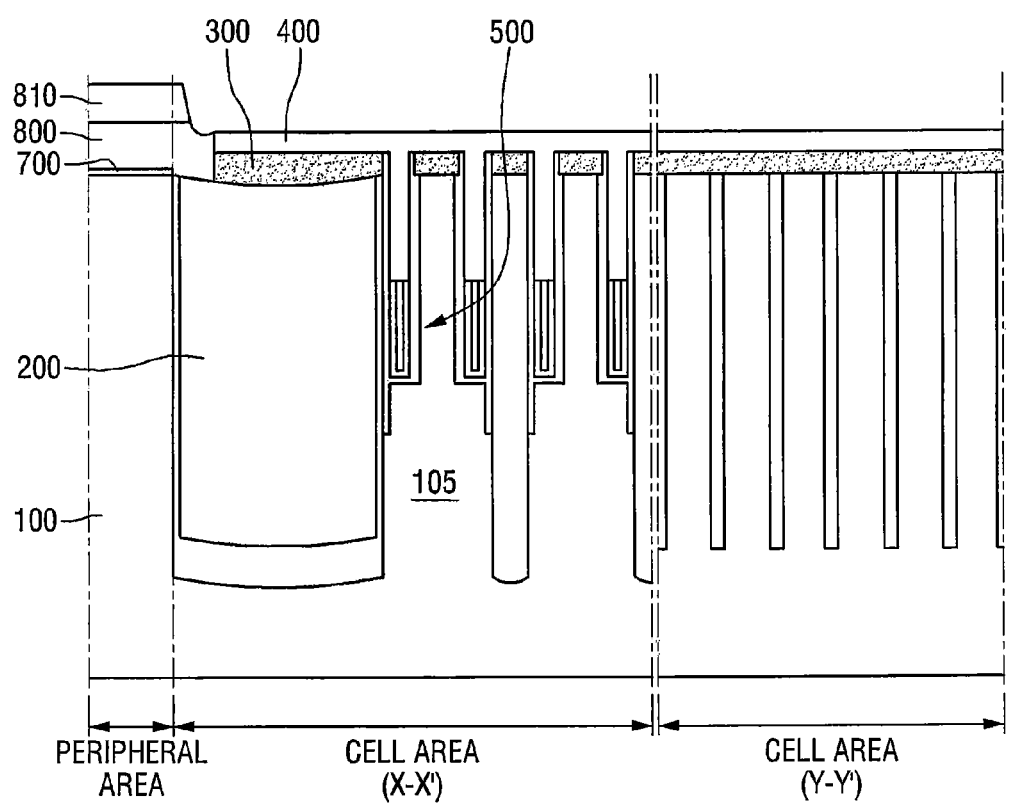

In this process, as described herein, when the poly gate layer 800 in the cell area is removed using the mask 810, a part of the poly gate layer 800 in the cell area may be removed. Therefore, a part of the poly gate layer 800 may remain in the cell area as illustrated in FIG. 12.

FIGS. 13 to 16 illustrate that after forming the poly gate layer 800 on the entire surface of the substrate 100 and before forming a contact 600, the poly gate layer 800 in the cell area may be removed using the mask 810. That is, the contact 600 may be formed later. It has been already described that when the poly gate layer 800 in the cell area is removed, a part of the poly gate layer 800 in the cell area may be removed. Therefore, a part of the poly gate layer 800' may remain in the cell area as illustrated in FIG. 16.

Figure 17:
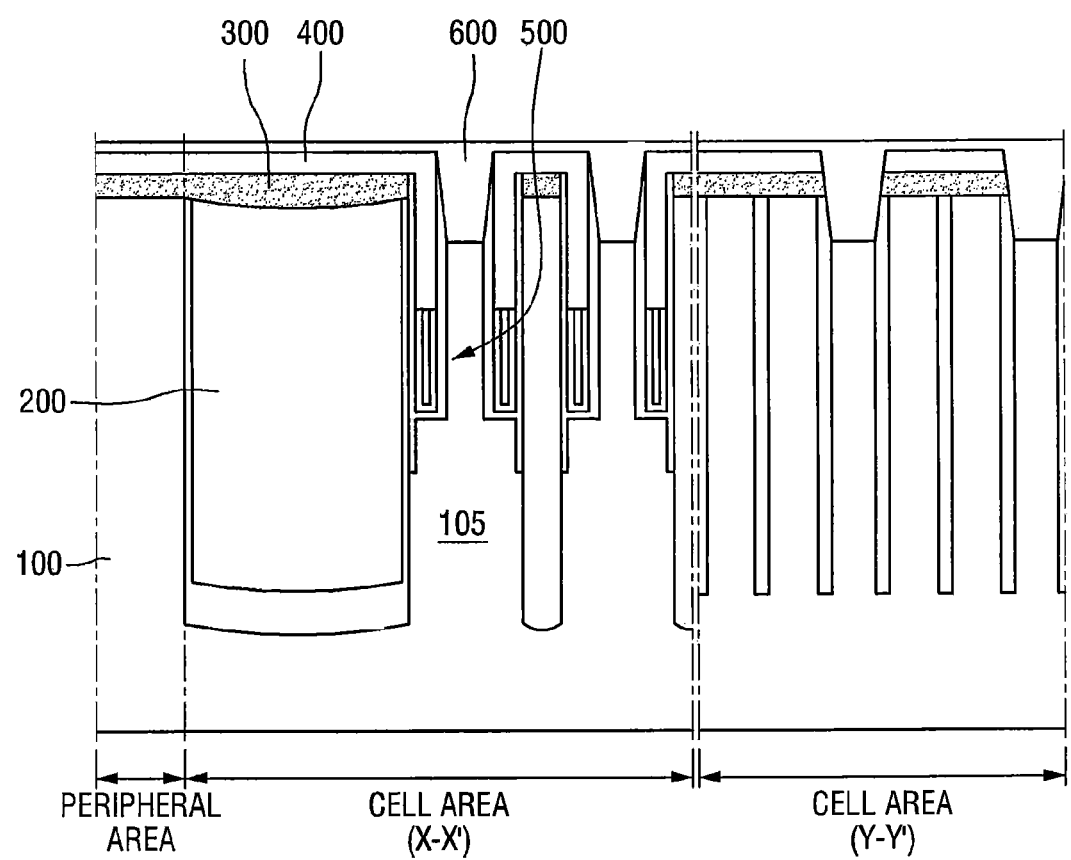
FIGS. 17 to 19 are diagrams illustrating intermediate steps of manufacturing methods of semiconductor memory devices according to embodiments of the present inventive concept.
Figure 18:
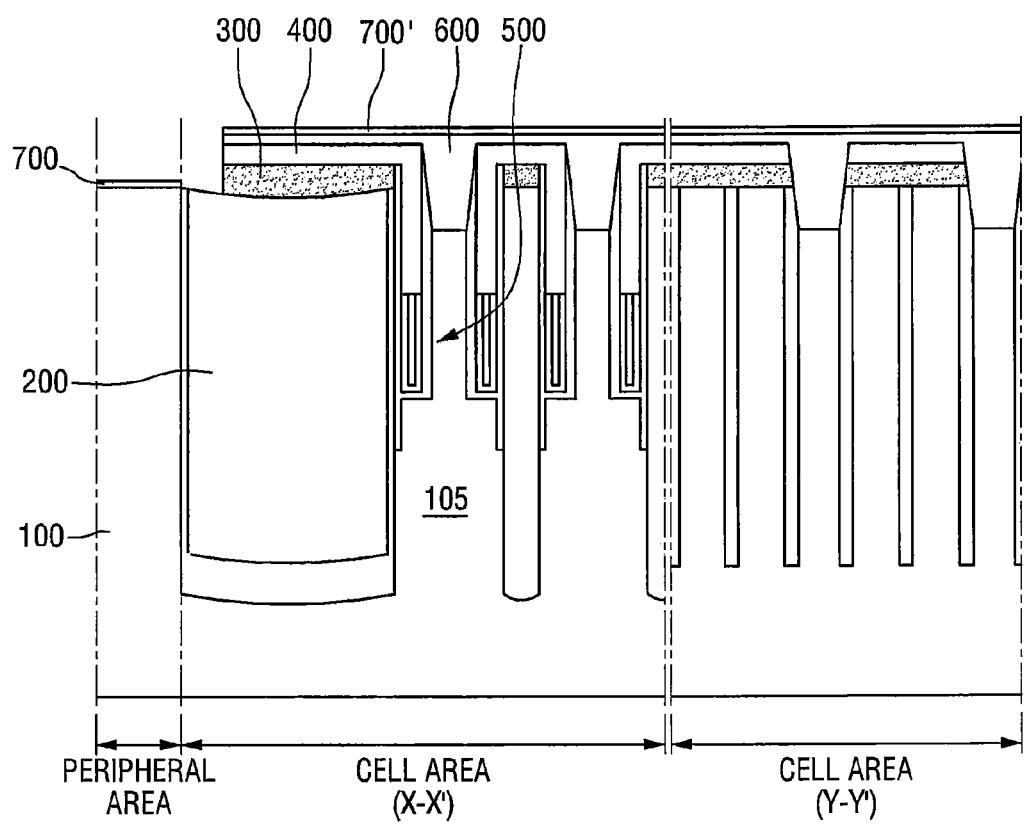
Figure 19:
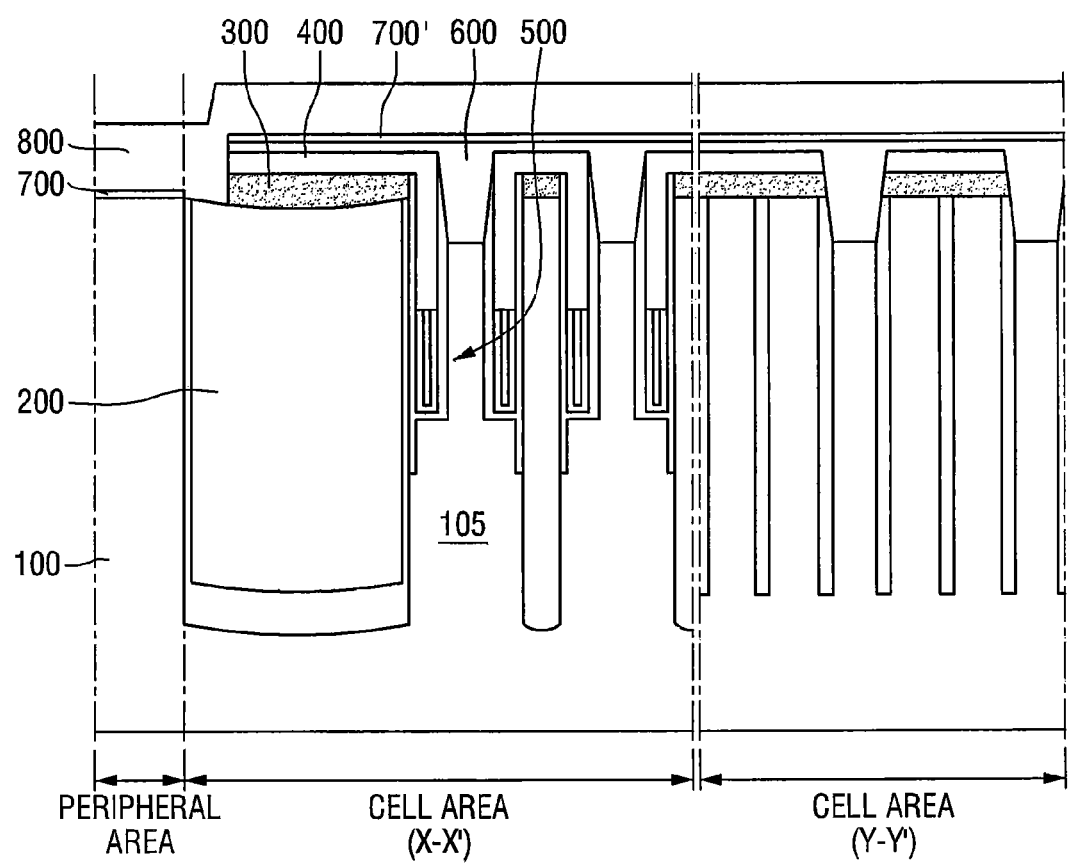

FIGS. 17 to 19 are diagrams illustrating intermediate steps of manufacturing methods of semiconductor memory devices according to still another embodiment of the present inventive concept.

Referring to FIGS. 4, 17 to 19, first, a substrate 100 in which a cell area and a peripheral area are defined may be prepared. In the cell area an active area 105 may be defined by the device isolating layer 200. Next, a mask pattern 300 may be formed on the substrate 100. So that the mask pattern 300 may serve as an interlayer insulating layer, the mask pattern 300 may be formed of an insulating material. The mask pattern 300 may include silicon oxide. Next, a capping insulating layer pattern 400 may be formed on the mask pattern 300. The capping insulating layer pattern 400 may be formed of a material having an etching selectivity with the mask pattern 300 and may include silicon nitride.

Next, referring to FIG. 17, a contact recess may be formed in the cell area and the contact recess may be filled with a contact material. The contact material may be formed on the entire surface of the substrate 100. That is, the contact material may be deposited on the entire surface of the substrate 100 while filling the contact recess and a part of the contact material may be removed using a planarization process such that part of the contact material remains.

Next, referring to FIG. 18, after removing the material from the peripheral area, which may include portions of the mask pattern 300 and the capping insulating layer pattern 400, a gate insulating layer 700 may be formed on a top surface of the substrate 100. In this case, the gate insulating layer 700 may not be formed on the entire surface of the substrate 100.

Next, referring to FIG. 19, a poly gate layer 800 may be formed on the entire surface of the substrate 100 and the poly gate layer 800 in the cell area may be removed. An area of the contact 600 may be increased by the contact material that is, the contact material may be the same as the material which is filled in the contact recess) which remains in the cell area, so that the resistance may be lowered. A concentration of the impurity which is doped in the contact material may be different from the concentration of the impurity which is doped in the material for the poly gate layer 800.

Next, an electronic system which may adopt semiconductor memory devices according to the embodiments of the present inventive concept will be described with reference to FIG. 20.

Figure 20:
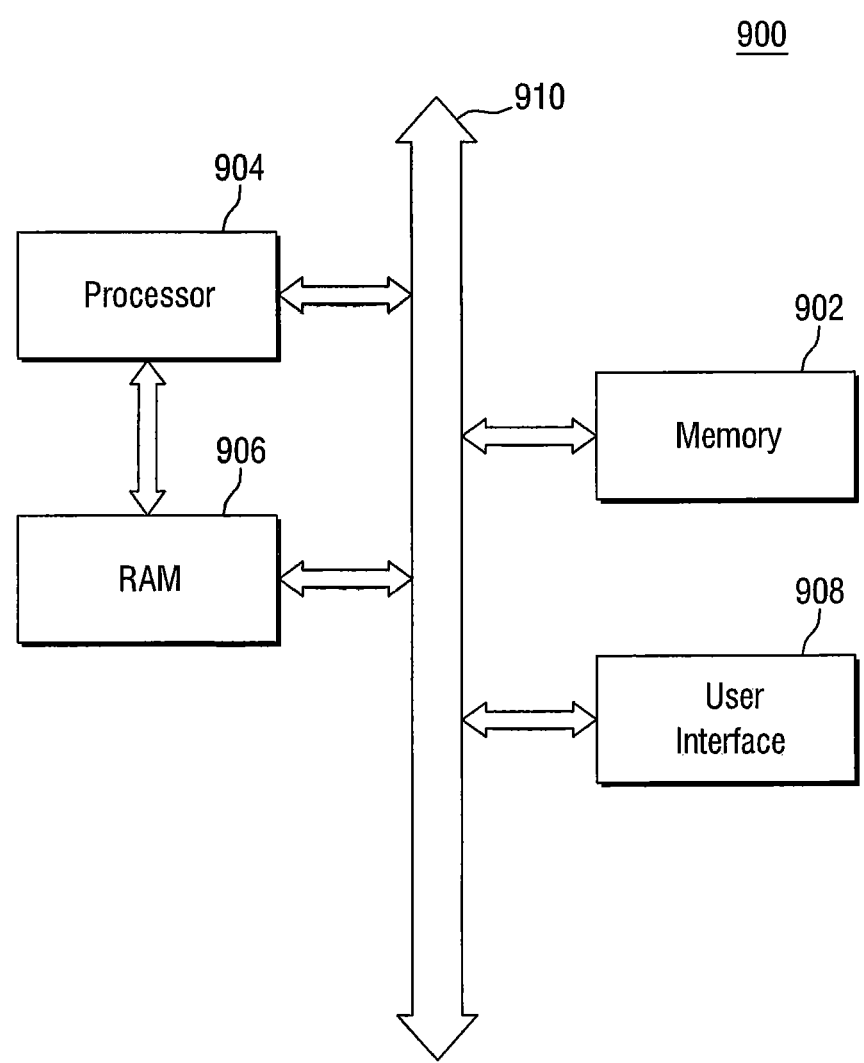
FIG. 20 is a block diagram illustrating a configuration of electronic systems in which memory devices according to embodiments of the present inventive concept may be employed.

FIG. 20 is a block diagram illustrating a configuration of an electronic system in which memory devices according to embodiments of the present inventive concept may be employed.

Referring to FIG. 20, the electronic system 900 may include a memory system 902, a processor 904, a RAM 906 and a user interface 908.

The memory system 902 the processor 904, the RAM 906, and the user interface 908 may perform data communication with each other using a bus 910.

The processor 904 may function to execute a program and control the electronic system 900 and may include at least one microprocessor, a digital signal processor, and a micro controller and at least one of logic elements which may perform a similar function thereto.

The RAM 906 may be used as an operational memory of the processor 904. Such a RAM 906 may be a volatile memory such as a DRAM and in this case, the above-described semiconductor memory devices may be employed for the RAM 906. In the meantime, the processor 904 and the RAM 906 may be integrated as one semiconductor element or a semiconductor package.

The user interface 908 may be used to input or output data into or from the electronic system 900. Examples of the user interface 908 may include a key pad, a key board, an image sensor, and a display device.

The memory system 902 may store a code for an operation of the processor 904, data which is processed by the processor 904, or data which is input from an external device. The memory system 902 may include a separate controller and may be configured to further include an error correcting block. The error correcting block may be configured to detect and correct an error of data stored in the memory system 902 by using an error correction code (FCC), In an information processing system such as mobile equipment or a desk top computer, a flash memory may be installed as the memory system 902. The flash memory may be configured by a semiconductor disk device, such as a solid-state drive (SSD). In this case, the electronic system 900 may stably store a large quantity of data in the flash memory.

The memory system 902 may be integrated as one semiconductor device. For example, the memory system 902 may be integrated as one semiconductor device to configure a memory card, such as a PC card (personal computer memory card international association (PCMCIA)), a CompactFlash (CF) card, smart media cards (SM, SMC), a memory stick, multimedia cards (MMC, RS-MMC, and MMCmicro), SD cards (SD, miniSD, microSD, and SDHC), and a universal flash storage (UFS).

Figure 21:
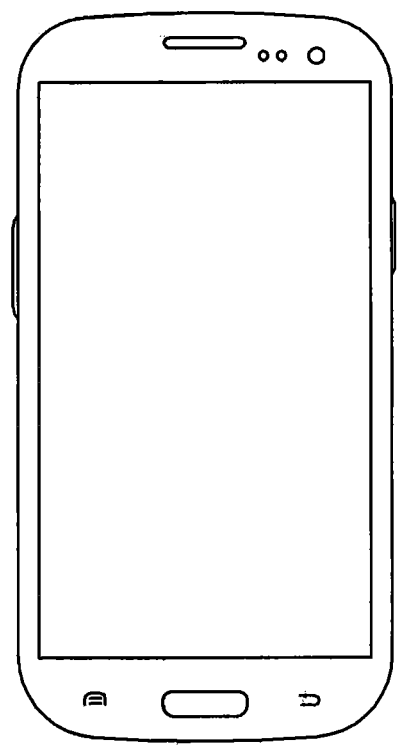
FIG. 21 is a view illustrating the electronic systems of FIG. 20 applied to a smart phone.

The electronic system 900 illustrated in FIG. 20 may be applied to an electronic control device of various electronic equipment. FIG. 21 is a view illustrating the electronic system 900 of FIG. 20 applied to a smart phone 1000. As described herein, when the electronic system (900 of FIG. 20) may be applied to the smart phone 1000, the electronic system (900 of FIG. 20) may be employed as a part of components of the application processor (AP).

Figure 22:
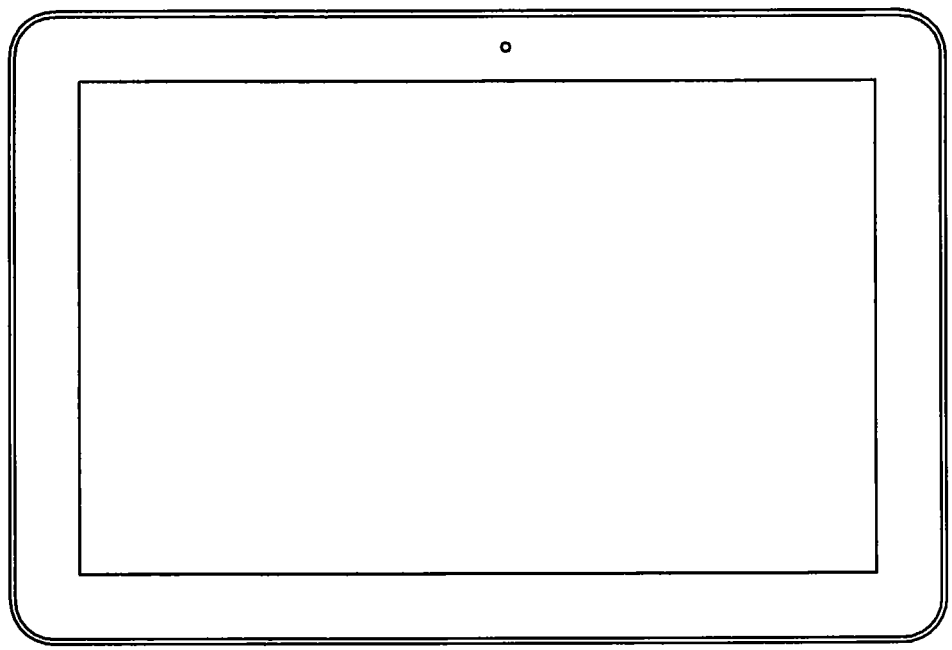
FIG. 22 is a view illustrating the electronic systems of FIG. 20 applied to a tablet PC.
Figure 23:
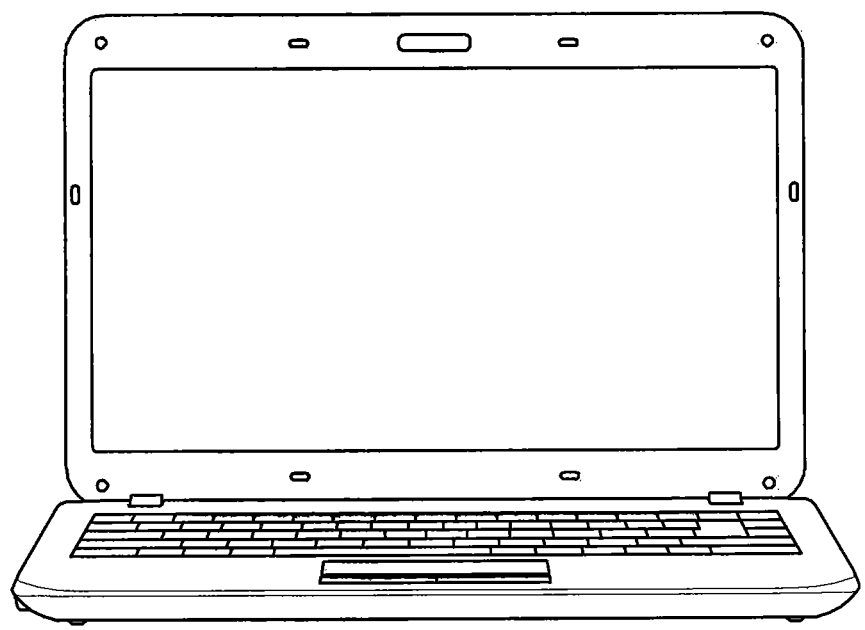
FIG. 23 is a view illustrating the electronic systems of FIG. 20 applied to a notebook computer.

The electronic system (900 of FIG. 20) may be employed in other various electronic equipment. FIG. 22 is a view illustrating the electronic system 900 of FIG. 20 applied to a tablet PC 1100, and FIG. 23 is a view illustrating the electronic system 900 of FIG. 20 applied to a notebook computer 1200.

For another example, the electronic system (900 of FIG. 20) may be provided as one of various constituent elements of an electronic device, such as a personal computer, an ultra-mobile PC (UMPC), a workstation, a net-book computer, personal digital assistants (PDA), a portable computer, a web tablet PC, a wireless phone, a mobile phone, an e-book reader, a portable multimedia player (PMP), a portable game device, a navigation device, a digital camera, a 3-dimensional television, a digital audio recorder, a digital audio player, a digital picture recorder, a digital picture player, a digital video recorder, a digital video player, a device capable of transceiving information in a wireless environment, one of various electronic devices configuring a home network, one of various electronic devices configuring a computer network, one of various electronic devices configuring a telematics network, an RFID device, or one of various constituent elements devices configuring a computing system.

When the electronic system (900 of FIG. 20) is equipment which may perform wireless communication, the electronic system (900 of FIG. 20) may be used in a communication system such as CDMA (Code Division Multiple Access), GSM (Global System for Mobile communication), NADC (North American Digital Cellular), E-TDMA (Enhanced-Time Division Multiple Access), WCDMA (Wideband Code Division Multiple Access), or CDMA2000.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A manufacturing method of a semiconductor memory device, comprising:
    forming a gate insulating layer on a peripheral area of a substrate, the gate insulating layer being not formed on a cell area of the substrate;
    forming a poly gate layer on the gate insulating layer and the cell area of the substrate;
    removing the poly gate layer from the cell area while leaving the poly gate layer on the peripheral area; and
    further comprising:
    forming a contact of a contact material in the cell area before removing the poly gate layer, wherein a first impurity concentration in the contact material is different from a second impurity concentration in the poly gate layer.

2. The manufacturing method of claim 1, wherein removing the poly gate layer comprises removing a part of the poly gate layer from the cell area.

3. The manufacturing method of claim 1, wherein removing the poly gate layer from the cell area further comprises:
    forming a mask on the cell area and on the poly gate layer on the gate insulating layer; and
    removing a portion of the mask such that the mask over the cell area is removed and the mask over the peripheral area remains.

4. The manufacturing method of claim 3, wherein forming the mask results in a mask with a step in a mask material of the mask such that the mask material has a first thickness over the peripheral area that is greater than a second thickness over the cell area.

5. The manufacturing method of claim 4, wherein removing the mask comprises using a planarization process.

6. A manufacturing method of a semiconductor memory device, comprising:
    forming a contact recess in the cell area;
    filling the contact recess with a contact material;
    forming a layer of the contact material on a top surface of the substrate;
    removing a plurality of material from the substrate in the peripheral area;
    forming a gate insulating layer on the peripheral area and on the layer of the contact material on the cell area;
    forming a poly gate layer on the gate insulating layer and on the substrate; and
    removing the poly gate layer from the cell area.

7. The manufacturing method of claim 6, wherein a first impurity concentration in the contact material is different from a second impurity concentration in the poly gate layer.

8. The manufacturing method of claim 6, wherein the forming a layer of the contact material on the top surface of the substrate comprises;
    depositing the contact material on the top surface of the substrate; and
    removing a part of the contact material using a planarization process.

9. A manufacturing method of a semiconductor memory device, comprising:

forming a gate insulating layer on a peripheral area of a substrate;

forming a poly gate layer on the gate insulating layer and on a capping layer in a cell area of the substrate;

forming a mask on the poly gate layer on the peripheral area and on the cell area;

etching the mask until the poly gate layer on the cell area is exposed to leave a portion of the mask on the peripheral area;

etching the poly gate layer in the cell area using the portion of the mask on the peripheral area;

forming a plurality of contacts in the cell area; and etching the plurality of contacts in the cell area using the portion of the mask on the peripheral area.

10. The manufacturing method of claim 9 wherein etching the poly gate layer in the cell area further comprises exposing the capping layer.

11. The manufacturing method of claim 9, wherein forming the mask results in a mask with a step in a mask material of the mask such that the mask material has a first thickness over the peripheral area that is greater than a second thickness over the cell area.

12. The manufacturing method of claim 9, wherein when forming the poly gate layer and when forming the plurality of contacts, a first impurity concentration in the plurality of contacts is different from a second impurity concentration in the poly gate layer.

* * * * *